(12) United States Patent
Subramanian

(10) Patent No.: US 7,459,363 B2
(45) Date of Patent: Dec. 2, 2008

(54) LINE EDGE ROUGHNESS REDUCTION

(75) Inventor: Krupakar M. Subramanian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 11/359,142

(22) Filed: Feb. 22, 2006

(65) Prior Publication Data

US 2007/0196980 A1 Aug. 23, 2007

(51) Int. Cl.
*H01L 21/8242* (2006.01)

(52) U.S. Cl. .................. 438/253; 438/637; 438/689; 438/694; 438/717; 257/E21.256; 257/E21.257

(58) Field of Classification Search .................. 438/717
See application file for complete search history.

(56) References Cited

U.S. PATENT DOCUMENTS

| 5,968,844 | A | 10/1999 | Keller |
| 6,849,391 | B2 | 2/2005 | Yamaguchi et al. |
| 6,872,513 | B2 | 3/2005 | Meagley |
| 2004/0214109 | A1 | 10/2004 | Chen et al. |
| 2005/0084793 | A1 | 4/2005 | Yuch et al. |
| 2005/0084807 | A1 | 4/2005 | Meagley et al. |
| 2005/0098091 | A1 | 5/2005 | Babich et al. |
| 2005/0195413 | A1 | 9/2005 | Brill |
| 2006/0046483 | A1* | 3/2006 | Abatchev et al. ............ 438/689 |

OTHER PUBLICATIONS

Croon, J.A., et al., "Line Edge Roughness: Characterization, Modeling and Impact on Device Behavior", Proceedings of the IEDM 2002, pp. 307-310.
Eeca, et al. "International Technology Roadmap for Semiconductors, 2001 edition", http://public.itrs.net/Files/2001ITRS/Home.htm.
Leonardus, H.A., et al., "Influence of gate patterning on line edge roughness", J. Vac. Sci. Tech. B21 (6), pp. 3140-3143 (Nov./Dec. 2003).

* cited by examiner

*Primary Examiner*—N. Drew Richards
*Assistant Examiner*—Kyoung Lee
(74) *Attorney, Agent, or Firm*—Brooks Cameron & Huebsch, PLLC

(57) ABSTRACT

A method for reducing line edge roughness comprises forming a masking structure on a substrate assembly, wherein the substrate assembly includes a number of layers. The method includes forming a layered masking structure by depositing a layer of material on the masking structure in order to reduce a line edge roughness (LER) of the masking structure, and etching a pattern of the layered masking structure into one or more of the number of layers of the substrate assembly before trimming the layered masking structure.

20 Claims, 5 Drawing Sheets

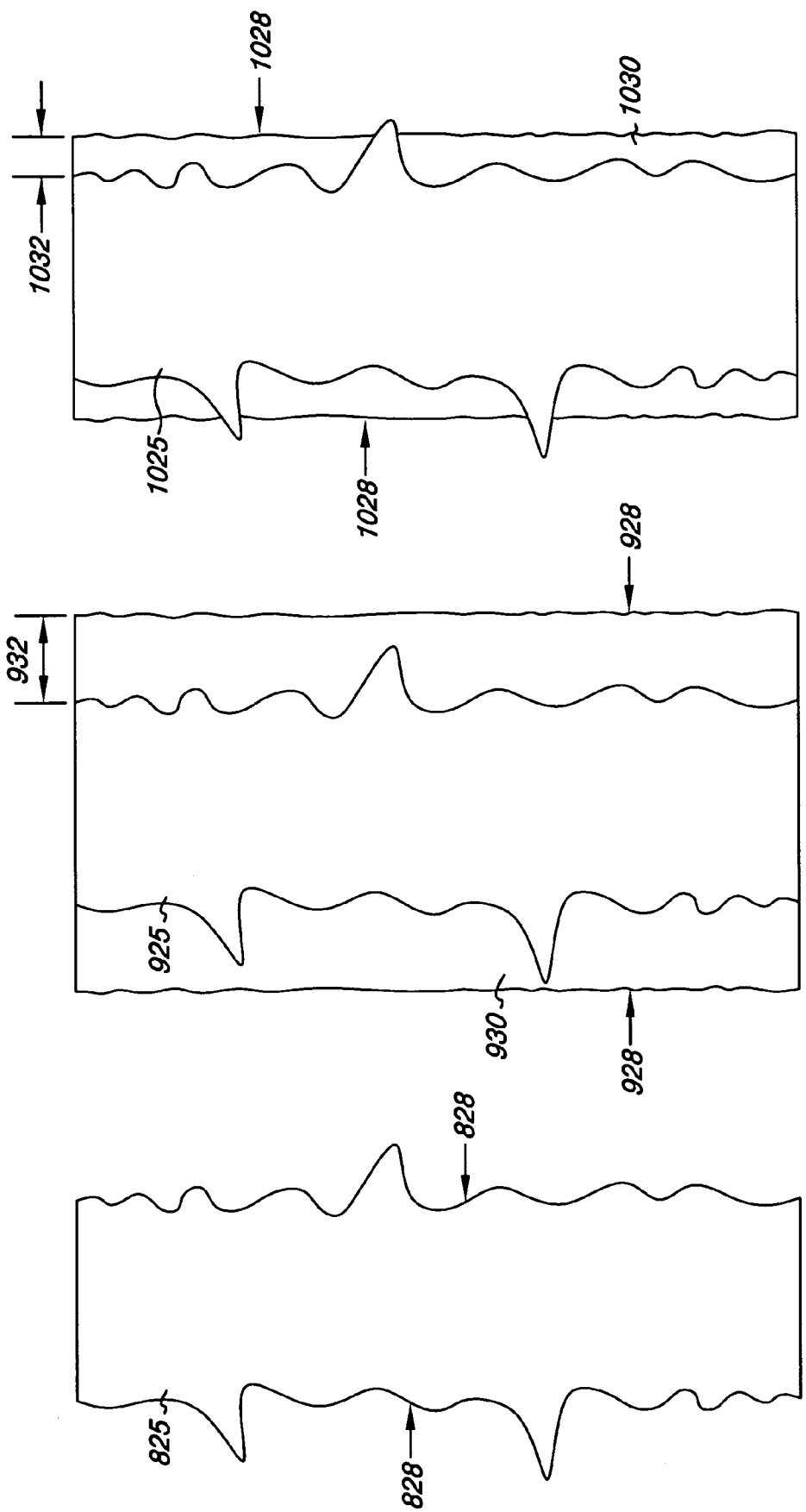

LINE EDGE ROUGHNESS REDUCTION

TECHNICAL FIELD

The present disclosure relates to methods of etching substrates. More particularly, the present disclosure relates to etching methods used to reduce line edge roughness of patterned features by using a layered masking structure.

BACKGROUND OF THE INVENTION

In fabricating integrated circuit components, photolithographic patterning and etch can be used to transfer a desired pattern of a masking material, such as a photoresist, to an underlying substrate material or materials. The masking material pattern can include a series of spaced projections atop the underlying substrate material such that etching can thereby produce a corresponding series of spaced features in the underlying substrate material or materials.

Advances in photolithography have enabled increasingly smaller patterns to be transferred into substrate materials, which can allow the formation of smaller integrated circuit components at lower cost. However, photolithographic methods are subject to line edge roughness (LER). LER can refer to roughness on the surface of masking material patterns and on the sidewalls of the underlying substrate features after the masking pattern is transferred.

It is desirable that the walls of masking patterns and/or features etched therefrom be smooth. However, as device dimensions and, accordingly, mask features get smaller, the walls of masks and/or features etched therefrom can become intolerably rough. The line edge roughness can result in undesirable effects in integrated circuit components, such as transistor leakage, for example. LER effects can become more of a problem as the critical dimensions of transferred patterns become increasingly smaller.

One prior approach to reducing LER of a photoresist masking feature comprises a short isotropic etch using a halogen-containing gas after mask formation. However, such approach does not adequately improve sidewall LER, reduces, or "trims," the thickness of the photoresist mask features, and can form breaks in long-running masking features, such as in parallel lines.

Accordingly, it is desirable to identify an improved method of reducing LER of masking features and patterned features formed therefrom using photolithographic processes.

SUMMARY OF THE INVENTION

Embodiments of the present disclosure include methods for reducing line edge roughness of etched substrates. One embodiment includes forming a masking structure on a substrate assembly that has a number of layers, forming a layered masking structure by depositing a layer of material on the masking structure in order to reduce a line edge roughness (LER) of the masking structure, and etching a pattern of the layered masking structure into one or more of the number of layers of the substrate assembly before trimming the layered masking structure.

In various method embodiments, the material deposited on the masking structure can be deposited using a plasma source and a flow rate of at least about 60 standard cubic centimeters per minute (sccm). In various embodiments, the deposited material can be a polymer material. The polymer can comprise chemistries that include silicon, carbon, and fluorine, for example. Also, in various embodiments, the masking structure can be a photoresist masking structure. In some embodiments, the method includes trimming the walls of the photoresist masking structure prior to depositing the layer of polymer on the photoresist masking structure.

In various embodiments, the material deposited on the masking structure can be substantially conformal over the masking structure. Also, in various embodiments, the deposited material has a thickness of no more than about 10 nanometers. In some embodiments, the thickness of the deposited material can be substantially equal to a sidewall roughness of the masking structure. In various embodiments, the deposition includes using a deposition time of no more than about 10 seconds.

In some method embodiments, the method includes trimming at least one wall of the pattern etched into one or more of the number of layers of the substrate assembly, after the etching, to reduce a LER of the etched pattern. In some embodiments, trimming the at least one wall after etching reduces the LER of the etched pattern by at least 25% with respect to the LER associated with the masking structure. In such method embodiments, the method may include removing the layered masking structure before trimming the wall of the pattern etched into the substrate assembly.

In some method embodiments, the method can include forming a photoresist masking structure on a substrate assembly, the substrate assembly including a substrate layer and at least two target layers. In such embodiments, the method can include forming a layered masking structure by depositing a layer of polymer on the photoresist masking structure in order to reduce a LER of the photoresist masking structure, etching a pattern of the layered masking structure into the at least two target layers before trimming the layered masking structure, and selectively etching to create a lateral recess in at least one of the at least two target layers after the etching of the pattern into the at least two target layers.

Embodiments of the present disclosure also include a memory device that comprises a substrate layer and a patterned feature formed thereon. The patterned feature comprises an untrimmed polymerized mask feature used to create an etched feature and an etched feature formed beneath the untrimmed polymerized mask feature.

In various device embodiments, the polymerized mask feature comprises a layer of polymer deposited on a photoresist mask feature, wherein the etched feature has a wall that has a LER that is less than the LER associated with a wall of the photoresist mask feature. In some embodiments, the layer of polymer comprises silicon, carbon, and fluorine. In various embodiments, the width of the untrimmed mask feature defines a width of the etched feature formed beneath. In some embodiments, the etched feature includes one or more layers of material, at least one of which is transparent carbon.

Embodiments of the present disclosure also include an electronic system that comprises a controller and a memory device coupled to the controller. In such embodiments, the memory device can be formed including at least one assembly structure. The at least one assembly structure includes a substrate layer and a patterned feature formed thereon. In such embodiments, the patterned feature comprises an untrimmed polymerized photoresist mask feature, having a reduced LER due to a polymer flowed thereon, used to create an etched feature, and an etched feature formed beneath the untrimmed polymerized photoresist mask feature.

BRIEF DESCRIPTION OF THE DRAWINGS

FIG. 8 is a cross-sectional view of an exemplary portion of the embodiment of the masking structure of FIG. 1.

FIG. 9 is a cross-sectional view of an exemplary portion of the embodiment of the masking structure with the layer of material deposited thereon of FIG. 2.

FIG. 10 is another cross-sectional view of an exemplary portion of the embodiment of the masking structure with the layer of material deposited thereon of FIG. 2.

DETAILED DESCRIPTION

Figure 1:
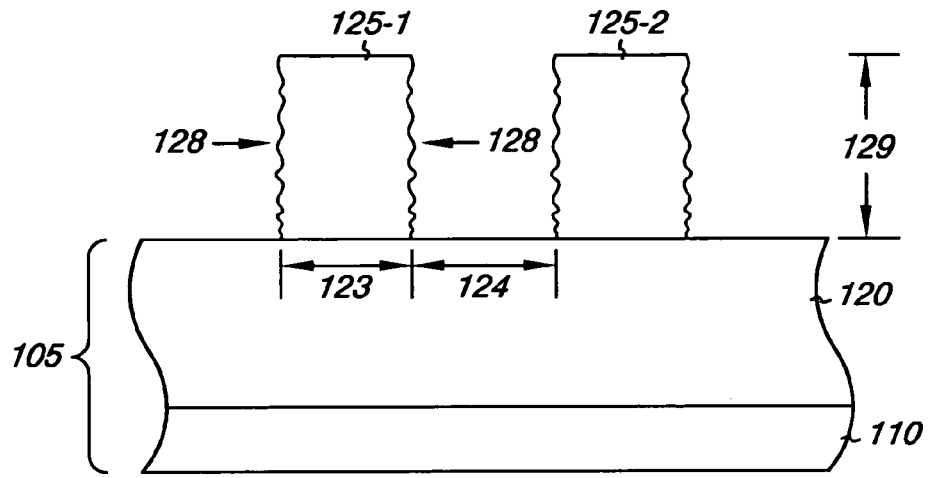
FIG. 1 is a cross-sectional view of an exemplary portion of an embodiment of a substrate assembly having a masking structure formed thereon in accordance with the present disclosure.

"Substrate" or "substrate assembly," as used herein, refers to a semiconductor substrate such as a base semiconductor layer or a semiconductor substrate having one or more layers, structures, or regions formed thereon. A base semiconductor layer may be the lowest layer of silicon material on a wafer or a silicon layer deposited on another material, such as silicon on sapphire or silicon on insulator, among other examples.

"Layer" as used herein can refer to a layer formed on a substrate using a deposition process. The term "layer" is meant to include layers specific to the semiconductor industry, such as "barrier layer," "dielectric layer," and "conductive layer." (The term "layer" is synonymous with the term "film" frequently used in the semiconductor industry). The term "layer" is also meant to include layers found in technology outside of semiconductor technology, such as coatings on glass. In the context of this document, the term "layer" encompasses both the singular and the plural unless otherwise indicated.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2.

One approach to an improved method of reducing LER of masking features and patterned features formed therefrom using photolithographic processes is described in U.S. patent application Ser. No. 11/206,414, filed on Aug. 18, 2005 by inventors Mirzafer Abatchev and Krupakar M. Subramanian and assigned to a common assignee as the present disclosure. The following disclosure describes alternative embodiments to the above referenced application.

Embodiments of the present disclosure will now be described in detail with reference to the accompanying figures. It should be noted that although the figures illustrate only one or two substrate assembly features, or structures, the substrate assemblies contemplated herein can have any number of features, or structures.

FIG. 1 is a cross-sectional view of an exemplary portion of an embodiment of a substrate assembly 105 having a masking structures 125-1 and 125-2 formed thereon in accordance with the present disclosure. The embodiment illustrated in FIG. 1 depicts substrate assembly 105 as comprising a base layer 110 and an overlaying layer 120. As mentioned above, base layer 110 can be a lowest layer of silicon material on a wafer or a silicon layer deposited on another material.

In the embodiment illustrated in FIG. 1, layer 120 can comprise one or more layers of material. For example, layer 120 can include various layers of conductive, insulative, and/or semiconductive materials. In one embodiment, layer 120 includes a carbon layer, a dielectric anti-reflective coating (DARC) layer, and a bottom anti-reflective coating (BARC) layer. In various embodiments, layer 120 can be described as and referred to as a target layer because the layer is the target of an etching process by which a predetermined pattern is transferred, or etched, into one or more layers of layer 120.

The embodiment illustrated in FIG. 1 also includes masking features 125-1 and 125-2 formed on layer 120 of substrate assembly 105. Masking features 125-1 and 125-2 project from layer 120 and include sidewalls 128 having an associated line edge roughness (LER).

Features 125-1 and 125-2 may be comprised of a single material or multiple materials, may be homogeneous or non-homogeneous, and may comprise one or more hard masking layers. For example, features 125-1 and 125-2 can include a photoresist material (e.g., a 13.5 nanometer photoresist, a 193 nanometer photoresist, and a 248 nanometer photoresist, among other photoresists), diamond-like carbon (DLC), transparent carbon (a form of amorphous carbon), silicon nitride, aluminum, titanium nitride, crystalline and/or amorphous silicon (doped or undoped), metal silicides, silicon dioxide (doped or undoped), silicon carbide, among other materials. Also, the features 125-1 and 125-2 may be comprised of the same or different materials, respectively. As used herein, photoresist refers to a material that includes a photoactive compound that undergoes a chemical change in response to exposure to actinic energy, or the like, such that the material can be patterned using solvent or other processing subsequent to actinic energy exposure.

Features 125-1 and 125-2 have a width 123 that may be referred to herein as a critical dimension (CD). Embodiments of the present disclosure contemplate various widths 123, including widths above and below about 65 nanometers, for example. Features 125-1 and 125-2 project from the upper surface of layer 120 by a distance 129. Distance 129 can be from about 100 to 200 nanometers, but embodiments of the present disclosure are not so limited.

In the embodiment illustrated in FIG. 1, masking features 125-1 and 125-2 are depicted as having vertical walls. However, embodiments of the present disclosure are not limited to mask features having vertical walls 128. For example, mask features 125-1 and 125-2 may have laterally inward or outward tapered walls. Also, embodiments of the present disclosure contemplate various LERs associated with sidewalls 128, including values above and below 4 nanometers.

FIG. 1 also illustrates masking features 125-1 and 125-2 as being separated by a distance 124, which may or may not be equal to distance 123, i.e., separation distance 124 may be larger or smaller than width 123.

Figure 2:
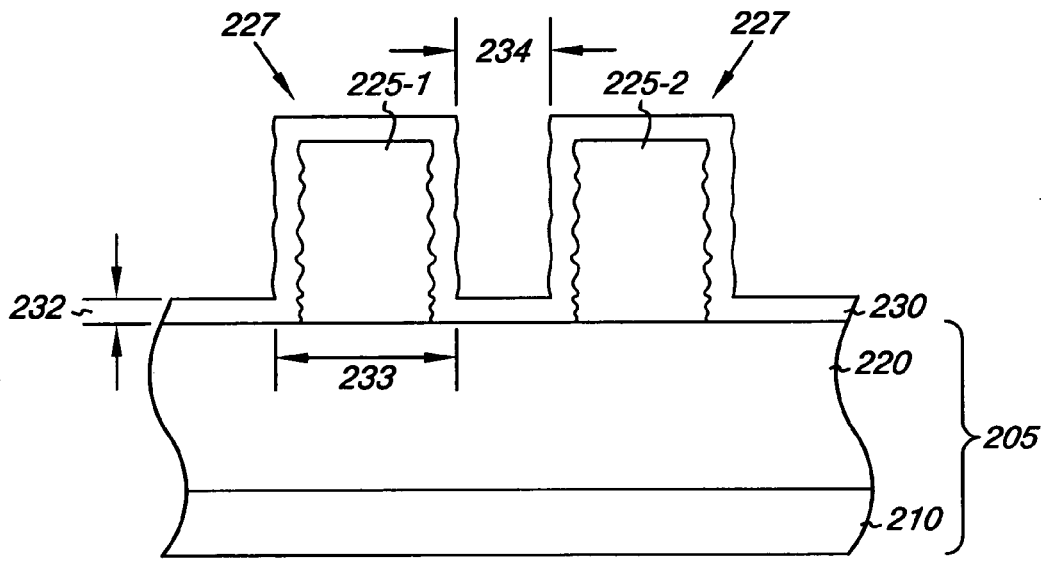
FIG. 2 is a cross-sectional view of an exemplary portion of the embodiment of the substrate assembly in FIG. 1 after a layer of material is deposited over the masking structure.

FIG. 2 is a cross-sectional view of an exemplary portion of the embodiment of the substrate assembly 105 in FIG. 1 after a layer of material 230 is deposited over the masking structures 125-1 and 125-2. That is, FIG. 2 illustrates the embodiment of FIG. 1 subsequent to a deposition process step.

As illustrated in FIG. 2, layer 230 is deposited over masking features 225-1 and 225-2, e.g., photoresist masking features, to form a layered masking structure 227 on a substrate assembly 205. Similar to assembly 105, substrate assembly 205 includes a base layer 210 and an overlaying layer 220.

Layer 230 can comprise one or more materials including various polymers and/or oligomers such as a polyol, an olefin, a wax, a steroid, an alkaloid, or a fatty acid, among others. In various embodiments of the present disclosure, layer 230 can comprise a polymer that includes silicon, carbon, and fluorine. Layer 230 has a thickness 232. In various embodiments, layer 230 is substantially conformal over mask features 225-1 and 225-2. However, embodiments are not limited to a conformal layer 230, e.g., the thickness 232 of layer 230 may be greater or lesser on the top surfaces of features 225-1 and 225-2 than on the walls of features 225-1 and 225-2, for example.

Layer 230 may be deposited by various manners, including physical vapor deposition, chemical vapor deposition, and/or atomic layer deposition, among other manners of deposition. In various embodiments, a plasma source, e.g., an inductive plasma source (IPS), may be used to deposit layer 230. In some embodiments, layer 230 is deposited using an Applied Materials IPS oxide etcher processing tool with a $CF_4$/Ar chemistry. In such embodiments, a preferred flow rate may be at least about 60 sccm and a preferred deposition time may be not more than about 10 seconds.

In various embodiments of the present disclosure, the LER of the mask feature, e.g., a photoresist mask feature, is reduced after the deposition process step illustrated in FIG. 2. That is, depositing a material, e.g., a polymer, on a masking feature 225-1 can result in layered masking structure 227 having a reduced LER as compared with the LER of the underlying feature 125-1. In some embodiments, the LER of layered masking structure 227 may be further reduced by trimming underlying feature 125-1 prior to the deposition process step of FIG. 2. That is, in such embodiments, trimming the walls of feature 125-1 can reduce the LER associated with feature 125-1, which can be further reduced by depositing a layer of material thereon. In this manner, the LER of layered masking structure 227 can be lower if feature 125-1 is trimmed prior to the deposition process step of FIG. 2 than if the deposition process step is performed on an untrimmed feature 125-1.

Increasing the deposition flow rate can also result in improved/reduced LER. The improved LER may be the result of polymer clusters forming in the gas phase. As the gas flow rate increases, the velocity of the clusters also increases. The increased velocity clusters may result in a better LER as the clusters spread over a relatively larger area. Increasing the flow rate may also result in the formation of larger polymer clusters as the quantity of gas increases. The larger clusters can spread over relatively larger areas on the substrate assembly and masking features resulting in improved smoothness of the feature sidewalls as the rough edges are filled.

As will be discussed further in connection with FIGS. 8-10, the thickness 232 of layer 230 in the embodiment illustrated in FIG. 2, may be greater or less than the LER associated with the walls of masking features 225-1 and 225-2. For example, in various embodiments, the thickness 232 is no more than about 10 nanometers.

In the embodiment illustrated in FIG. 2, the layered masking feature 227 has a width 233 that may be larger than the width of a masking feature, e.g., a width 123 of feature 125-1 in FIG. 1, due to the deposition of layer 230 which has an associated thickness 232. Similarly, the distance 234 between the layered masking features 227 may be smaller than the distance 124 between the masking features 125-1 and 125-2 in FIG. 1 due to the deposition of layer 230. Layered masking feature 227 has walls 228 that have an associated LER that, in various embodiments, is less than the LER associated with the walls of the masking features 225-1 and 225-2. As mentioned above, in such embodiments, the reduced LER is the result of material 230, e.g., a polymer, forming gaseous gas clusters which can spread over walls 228 during the deposition process.

As previously mentioned, in various embodiments, features 225-1 and/or 225-2 can comprise a photoresist material and layer 230 can comprise a polymer. In such embodiments, layered masking feature 227 can be referred to as a polymerized photoresist masking structure or as a polymerized photoresist mask feature.

Figure 3:
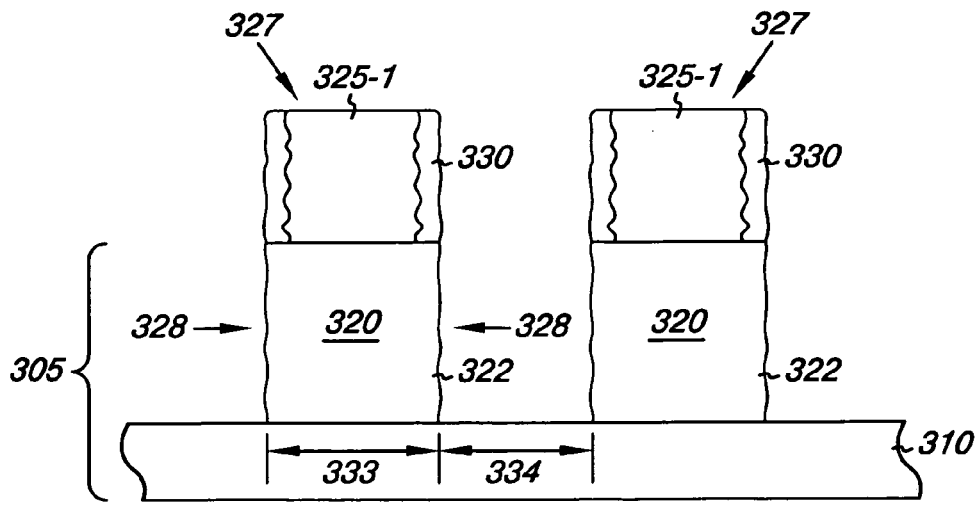
FIG. 3 is a cross-sectional view of an exemplary portion of the embodiment in FIG. 2 after an etching process.

FIG. 3 is a cross-sectional view of an exemplary portion of the embodiment in FIG. 2 after an etching process. In the embodiment illustrated in FIG. 3, layer 320 of substrate assembly 305 has been etched using layered masking features 227 as a mask. That is, the masking pattern shown in FIG. 2 has been transferred into layer 320 via an etching process, resulting in the creation of features 322 beneath the layered masking features 327. The etching chemistry used in the etching process may include one or more of nitrogen fluoride, e.g., $NF_6$, sulfur fluoride, e.g., $SF_6$, sulfur dioxide ($SO_2$), and oxygen ($O_2$), among other etching chemistries. Such etching may or may not be conducted in an isotropic manner and may or may not utilize plasma. The etching tools used in the etching process can include a LAM TCP 9400 etcher, or various other etching tools.

As illustrated in the embodiment shown if FIG. 3, layered masking features 327 comprise masking features 325-1 and 325-2, e.g., photoresist masking features, and a overlaying layer of material 330, e.g., a polymer layer. As illustrated in FIG. 3, the thickness of the layer of material 330 can be reduced, and can be partially or entirely removed from the surface of masking features 325-1 and 325-2, during the etching process. In various embodiments of the present disclosure, the layered masking features 327 are untrimmed prior to transferring the masking pattern shown if FIG. 2 into layer 320. As used herein, trimming generally refers to etching sidewalls of features, e.g., the walls of masking features 325-1 and/or 325-2, the walls of layered masking features 327, and the walls of features 322 formed in layer 320. For example, the layered masking feature 327 can be considered untrimmed because the material 330 on the sides has not been etched prior to the etching process used to transfer the masking pattern into layer 320. It is noted that walls of layered masking features 327 can be considered untrimmed despite the fact that a portion of layer 330 on the walls may have been removed during the etching process step resulting in the embodiment illustrated in FIG. 3.

The etching shown in the embodiment illustrated in FIG. 3 results in patterned features 322 in layer 320 beneath the layered masking features 327. The patterned features 322 have walls 328 that have an associated LER which can be less than the LER associated with the walls of masking features 325-1 and/or 325-2, for example. In various embodiments, the LER associated with walls of patterned features 322 is less than the LER associated with the walls of patterned features 227 in FIG. 2.

As will be discussed further below, in various embodiments of the present disclosure, it may be beneficial to trim the walls 328 of the patterned features 322 after the etching process of FIG. 3 rather than to trim the walls of the masking features, e.g., 225-1 and 225-2, and/or the walls of layered masking features 227 before the etching process of FIG. 3. That is, it may be beneficial to trim features 322 after transferring an untrimmed masking pattern 227 into layer 320. For example, if the material 230 is a polymer and layer 320 comprises a material such as carbon, then trimming walls 328 rather than masking feature 225-1 and/or material 230 deposited thereon can result in a LER associated with walls 328 that is less than the LER that the walls 328 would have had if feature 225-1 and/or material 230 were trimmed prior to the etching process of FIG. 3.

In the above example, the reduced LER due to not trimming the walls of layered masking features 227 (i.e., due to transferring an untrimmed masking feature 227 to layer 320) prior to the etching process of FIG. 3, may occur because there may be relatively less stress released by trimming carbon than by trimming polymer, for example. The difference in stress release may be due to the fact that trimming polymer chains may cause the polymers to form chains with other molecules, which may cause stress that extends spatially, while trimming carbon does not result in polymer chains and can remove carbon individually.

It may also be beneficial to trim features 322 after transferring an untrimmed masking pattern 227 into layer 320. It may also be beneficial to transfer an untrimmed masking pattern into layer 320 for other reasons. For instance, in the above example, if the polymer layer 230 remains untrimmed, then a trimming chemistry to trim the polymer layer need not be developed and/or used.

The critical dimension 333 of the patterned features in layer 320 may be larger than the critical dimension of the masking feature, e.g., 325-1, contained in the overlaying mask. As discussed above, the critical dimension 333 can be increased due to the thickness of the layer, e.g., layer 330, deposited on the masking feature. That is, the increased width of a masking feature 325-1, due to deposition of layer 330, is transferred into layer 320 during the etching process. In other words, the width of the untrimmed mask feature 327 can define the width of the etched feature 332 formed beneath. Also, an increased critical dimension 333 can result in a reduced distance 334 between patterned features.

It is noted that the distance 233 in FIG. 2 may be greater or less than the critical dimension 333 shown in FIG. 3. For example, as illustrated, some of material 230 can be removed from the walls of layered masking feature 227 during the etching process that results in the embodiment illustrated in FIG. 3. That is, the thickness of layer 330 may be less than the thickness 232 of layer 230.

In the embodiment illustrated in FIG. 3, the etching process has removed the entirety of layer 320, i.e., the material not below layered masking structures 327, such that base layer 310 is exposed. As mentioned above, base layer 310 and overlaying layer 320 can include one or more layers of various materials. As one of ordinary skill in the art will appreciate, it is possible that the etching process not remove all of the layers of layer 320, and it is possible that the etching process does remove one or more layers comprising base layer 310.

Figure 4:
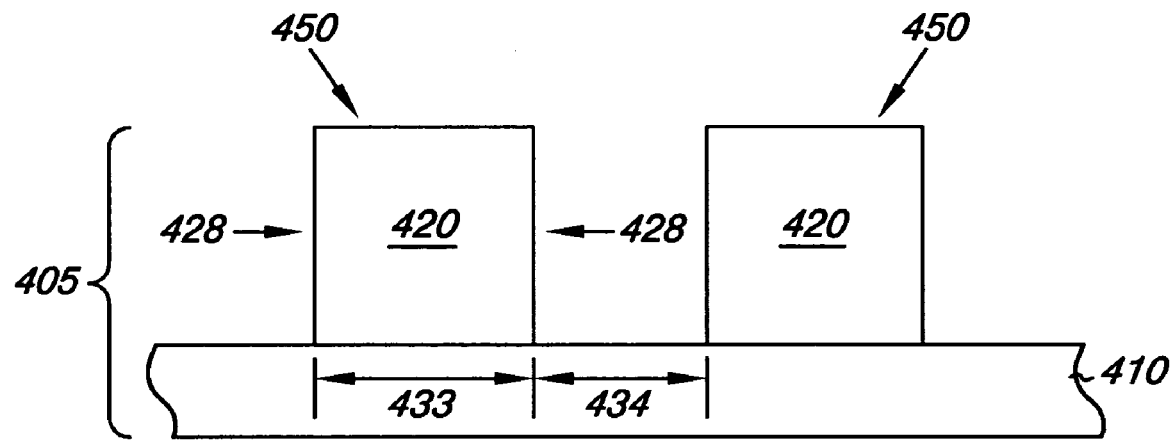
FIG. 4 is a cross-sectional view of an exemplary portion of the embodiment in FIG. 3 after a processing subsequent to that shown by FIG. 3.

FIG. 4 is a cross-sectional view of an exemplary portion of the embodiment in FIG. 3 after a processing subsequent to that shown by FIG. 3. The embodiment illustrated in FIG. 4 depicts the patterned layer 420 of substrate assembly 405 subsequent to a process step that removes (via one or more various well-known wet or dry cleaning processes) the layered masking structure, e.g., 327, from the upper surface of features 450 formed in layer 420. The features 450 formed on base layer 410 have walls 428 with an associated LER. The features 450 also have a critical dimension 433 and are separated by a distance 434.

Figure 5:
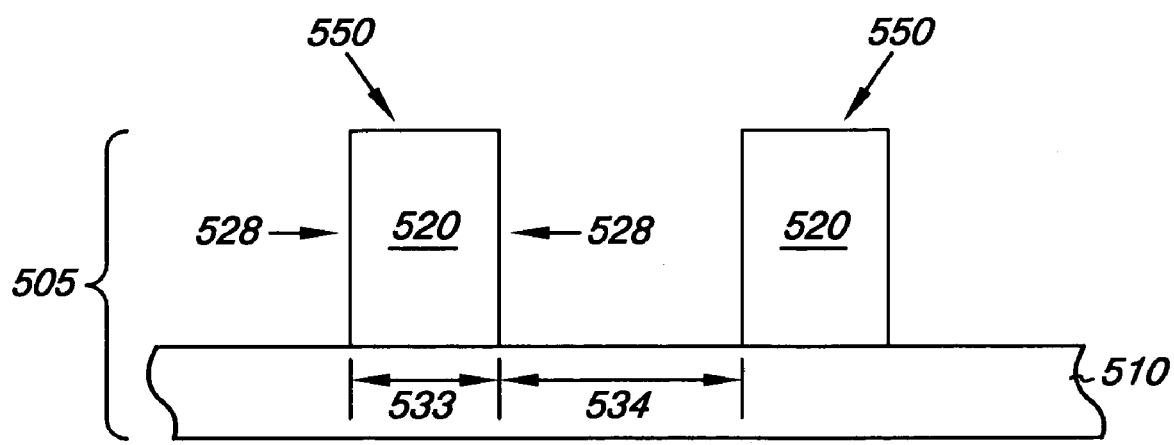
FIG. 5 is a cross-sectional view of an exemplary portion of the embodiment in FIG. 4 after a processing subsequent to that shown by FIG. 4.

FIG. 5 is a cross-sectional view of an exemplary portion of the embodiment in FIG. 4 after a processing subsequent to that shown by FIG. 4. The embodiment illustrated in FIG. 5 shows features 550 in layer 520 of substrate assembly 505 subsequent to trimming one or more walls 528 of features 550.

As mentioned above in connection with FIGS. 1-4, transferring a layered masking structure, e.g., an untrimmed masking structure such as that shown in FIG. 2, into a target layer such as layer 420, can cause an increased critical dimension 433 of feature 450. As noted above, it may be beneficial to trim the walls 428 in order to reduce the critical dimension 433 and/or to further reduce the LER of features 450. However, trimming the walls 428 of feature 450 may result in less deleterious effects, e.g., reduced LER, than trimming the walls of a layered masking structure, e.g., 327 in FIG. 3, before transferring such trimmed masking structures.

As mentioned above, in some embodiments, the walls of the underlying masking features, e.g., 325-1 and 325-1, may be trimmed prior to the deposition of a layer of material, e.g., layer 330 in FIG. 3. That is, in such embodiments, the masking features 125-1 and 125-2 shown in FIG. 1 can be trimmed to reduce the LER prior to the deposition process step illustrated in FIG. 2.

As illustrated in the embodiment shown in FIG. 5, features 550 on base layer 510 have trimmed walls 528 that have an associated LER. The LER associated with trimmed walls 528 can be lower than the LER associated with walls 428 of features 450 in FIG. 4. The features 550 have a critical dimension 533 that is reduced in comparison to dimension 433 of features 450 in FIG. 4. Also, features 550 are separated by a distance 534 which can be greater than the distance 434 between features 450 in FIG. 4.

Figure 6:
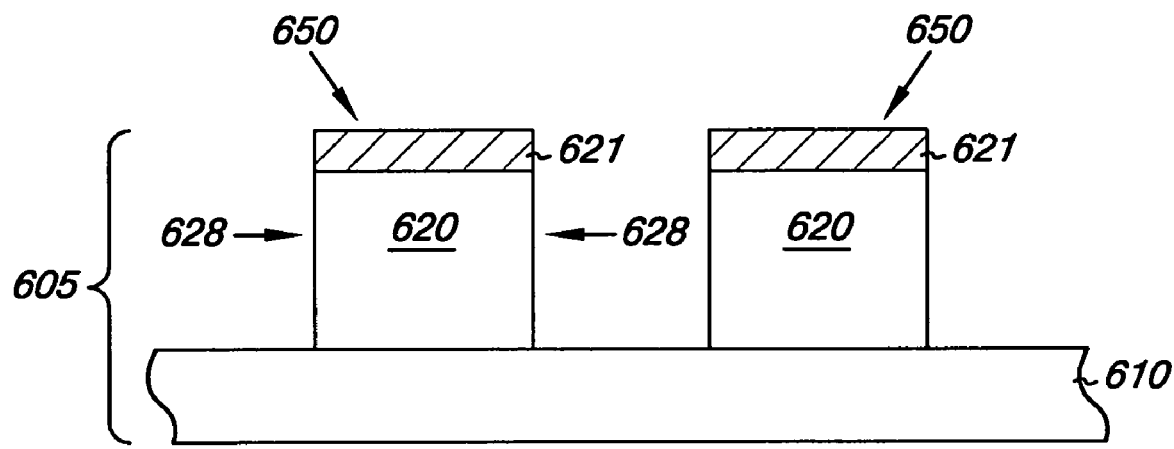
FIG. 6 is a cross-sectional view of an exemplary portion of the embodiment in FIG. 3 after a processing subsequent to that shown by FIG. 3.

FIG. 6 is a cross-sectional view of an exemplary portion of the embodiment in FIG. 3 after a processing subsequent to that shown by FIG. 3. The embodiment illustrated in FIG. 6 depicts the patterned layer 620 of substrate assembly 605 subsequent to a process step that removes (via one or more various well-known cleaning processes) the layered masking structure, e.g., 327, from the upper surface of features 650 formed in layer 620. The features 650 formed on base layer 610 have walls 628 with an associated LER.

As shown in the embodiment illustrated in FIG. 6, features 650 include a layer of material 621 formed on an upper portion of layer 620. Layer 621 can act as a hard mask and may comprise a dielectric anti-reflective coating (DARC).

Figure 7:
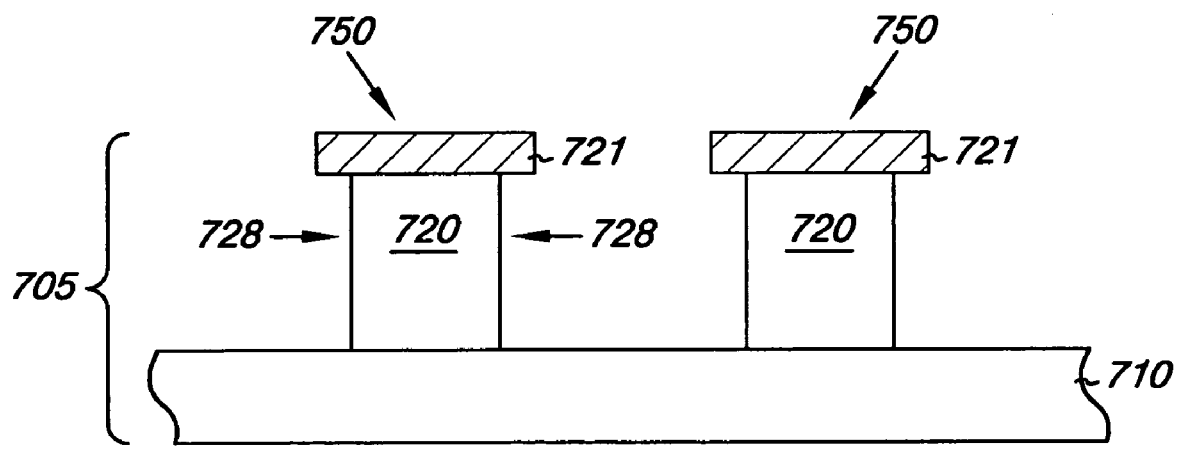
FIG. 7 is a cross-sectional view of an exemplary portion of the embodiment in FIG. 6 after a processing subsequent to that shown by FIG. 6.

FIG. 7 is a cross-sectional view of an exemplary portion of the embodiment in FIG. 6 after a processing subsequent to that shown by FIG. 6. The embodiment illustrated in FIG. 7 shows features 750 in layer 720 of substrate assembly 705 subsequent to trimming one or more walls 728 of features 750. As mentioned above, trimming one or more walls 728 can reduce the critical dimension of a feature 750 and may further reduce the LER associated with walls 728.

As illustrated in the embodiment shown in FIG. 7, trimming walls 728 of features 750 can form a lateral recess, e.g., an undercut, between a layer of material 721 formed on an upper portion of layer 720 and one or more layers of layer 720 below layer 721. For example, a lateral recess can be formed due to an etching chemistry, used to trim walls 728, that removes material in a layer or layers below layer 721 at a faster rate than material in layer 721.

Subsequent to the process step illustrated in FIG. 7, layer 721, e.g., a hardmask layer, can be removed via a wet or dry cleaning process such as a buffered oxide etch (BOE) cleaning process, for example. In various embodiments of the present disclosure, the walls 728 of features 750 can have a LER that is at least 25% less than a LER associated with a wall of a masking feature, e.g., wall 128 of masking feature 125-1, which was used to form features 750.

FIG. 8 is a cross-sectional view of an exemplary portion of the embodiment of the masking structure of FIG. 1, e.g., masking structure 125-1. FIG. 8 illustrates, in an enlarged manner, an exemplary masking feature 825 in cross-section prior to deposition of a layer of material on the feature. As shown in FIG. 8, the walls 828 of masking feature 825 have an associated LER.

FIG. 9 is a cross-sectional view of an exemplary portion of the embodiment of the masking structure with the layer of material deposited thereon of FIG. 2, e.g., layered masking feature 227. FIG. 9 depicts, in an enlarged manner, an exemplary masking feature 925 with a layer of material 930 deposited thereon.

In the embodiment illustrated in FIG. 9, the thickness 932 of layer 930 is larger than the LER associated with the walls of masking feature 925. For example, in this embodiment, if the walls of masking feature 925 have a LER of about 4 nanometers, then the thickness 932 is about 4 nanometers or greater. However, as discussed in connection with FIG. 10, in various embodiments, the thickness 932 may not be larger than the LER associated with the walls of feature 925. As previously mentioned, in various embodiments of the present disclosure, the thickness 932 can be no more than about 10 nanometers. A relatively small thickness 932 of layer 930 may be desirable because transferring a layered masking pattern, e.g., 227, into a substrate assembly can create an increased critical dimension of patterned features in substrate assembly layers as discussed above.

It is noted that although the walls 928 of the layered masking structure illustrated in FIG. 9 are shown as being smooth, the walls 928 can have an associated LER. In various embodiments, the LER associated with walls 928 is less than the LER associated with the walls of masking feature 925.

FIG. 10 is another cross-sectional view of an exemplary portion of the embodiment of the masking structure with the layer of material deposited thereon of FIG. 2, e.g., layered masking feature 227. FIG. 10 depicts, in an enlarged manner, an exemplary masking feature 1025 with a layer of material 1030 deposited thereon.

In the embodiment illustrated in FIG. 10, the thickness 1032 of layer 1030 is less than the LER associated with the walls of masking feature 1025. For example, in this embodiment, if the walls of masking feature 1025 have a LER of about 4 nanometers, then the thickness 1032 may be less than 4 nanometers. Although the layer of material 1030 deposited on the masking feature 1025 may be less than the LER associated with the walls of masking feature 1025, the masking structure illustrated in the embodiment of FIG. 10 can be considered a layered masking structure in accordance with various embodiments of the present disclosure. That is, a masking feature having a material deposited thereon is considered a layered masking feature without regard to the amount or thickness of the deposited material. For example, in embodiments of the present disclosure in which a layer of polymer material is deposited on a photoresist masking feature, the masking feature can be considered a polymerized photoresist masking feature, without regard to the amount of polymer deposited thereon.

Figure 11:
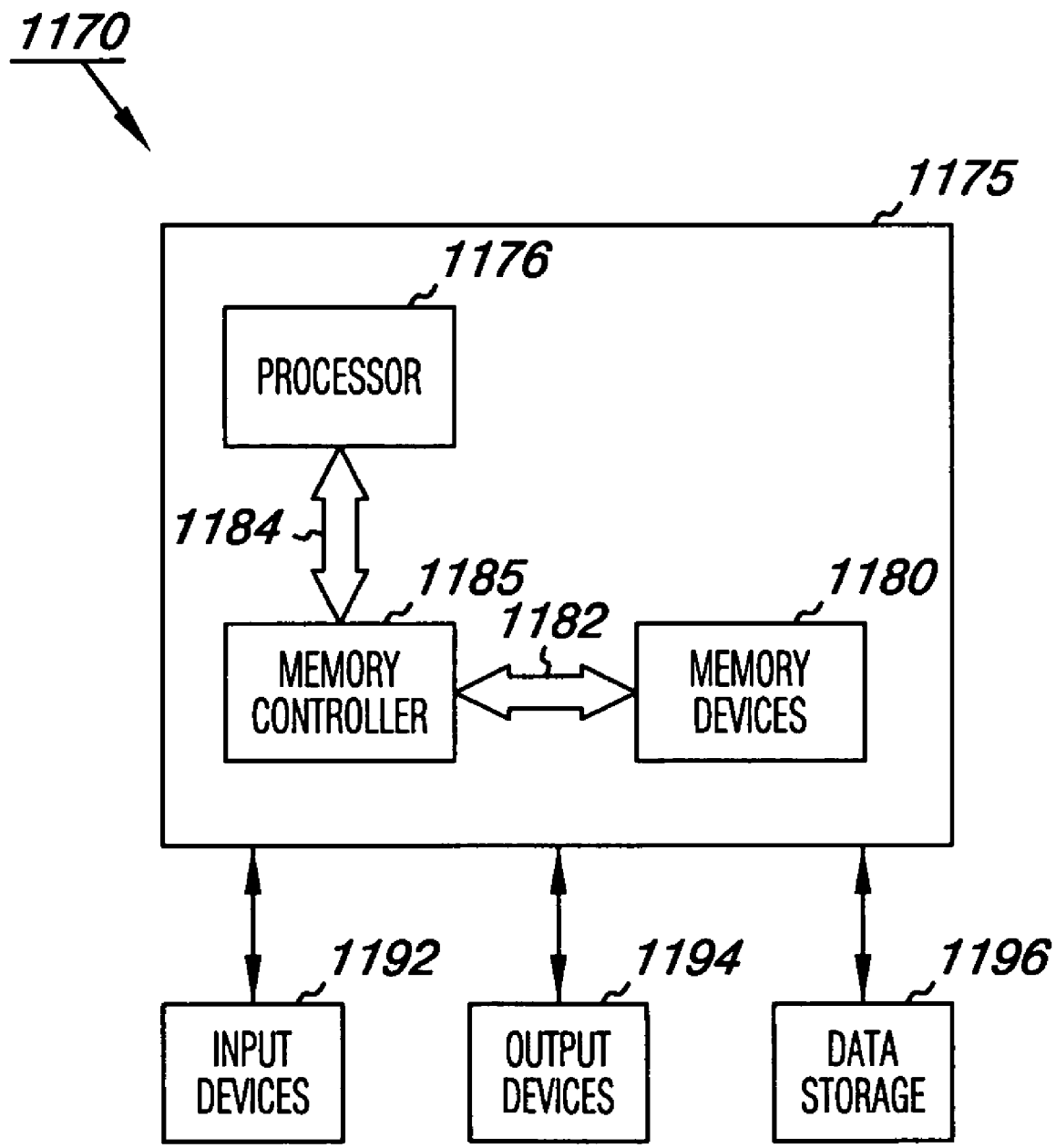
FIG. 11 illustrates a system having a memory device in which semiconductor substrate assemblies according to various embodiments of the present disclosure can be used.

FIG. 11 illustrates a system 1170 having a memory device 1180 in which semiconductor substrate assemblies according to various embodiments of the present disclosure can be used. That is, FIG. 11 illustrates a system 1170 that includes a memory device 1180 that can include a number of substrate assemblies such as the substrate assembly in FIG. 3. As shown in the embodiment illustrated in FIG. 11, system 1170 can include a computing unit 1175. Computing unit 1175 can include a processor 1176, a memory controller 1185, and one or more memory devices 1180. Memory devices 1180 can communicate with memory controller through a bus 1182. Memory controller 1185 controls data communication to and from the memory device 1180 in response to control signals received from the processor 1176 over a bus 1184.

The system 1170 may include one or more input devices 1192, e.g., a keyboard, transceiver, mouse, etc., connected to the computing unit 1175 to allow a user to input data, instructions, etc., to operate the computing unit 1175. One or more output devices 1194 connected to the computing unit 1175 may also be provided as part of the system 1170 to display or otherwise output data generated by the processor 1176. Examples of output devices include printers, video terminals, monitors, display units, etc. The system 1170 can also include one or more data storage devices 1196 connected to the computing unit 1175 to allow the processor 1176 to store data in or retrieve data from internal or external storage media. Examples of data storage devices 1196 include disk drives that accept hard and floppy disks, compact disk read only memories (CD-ROMs), compact disk read-write (CD-RW) memories, digital video disks (DVDs), etc.

In the foregoing Detailed Description, various features are grouped together in a single embodiment for the purpose of streamlining the disclosure. It will be readily appreciated to those of ordinary skill in the art that a wide variety of alternate embodiments, adaptations or variations of the preferred embodiment(s), and/or equivalent embodiments may be made without departing from the intended scope of the present disclosure as set forth in the appended claims. This method of disclosure, however, is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for reducing line edge roughness, comprising:
   forming a masking structure on a substrate assembly, the substrate assembly including a number of layers;
   forming a layered masking structure by depositing a layer of material on the masking structure in order to reduce a line edge roughness (LER) of the masking structure; and
   etching a pattern of the layered masking structure into one or more of the number of layers of the substrate assembly before trimming the layered masking structure; and
   trimming at least one wall of the pattern etched into the one or more of the number of layers of the substrate assembly, alter the etching, to reduce a LER of the etched pattern.

2. The method of claim 1, wherein depositing the layer of material on the masking structure includes using a flow rate of at least 60 standard cubic centimeters per minute (sccm).

3. The method of claim 1, wherein depositing the layer of material on the masking structure includes depositing a layer of polymer on the masking structure.

4. The method of claim 3, wherein depositing the layer of polymer on the masking structure includes depositing a polymer that comprises silicon, carbon, and fluorine.

5. The method of claim 1, wherein etching the pattern of the layered masking structure into one or more of the number of layers of the substrate assembly includes using an inductive plasma source.

6. A method of etching a substrate assembly, comprising:
forming a photoresist masking structure on the substrate assembly, the substrate assembly including a substrate layer and one or more target layers;
depositing a layer of material on the photoresist masking structure using a deposition flow rate of at least 60 sccm and thereby forming a layered masking structure having a reduced LER; and
transferring a pattern of the layered masking structure into the one or more target layers of the substrate assembly without trimming a wall of the layered masking structure before the pattern is transferred.

7. The method of claim 6, wherein the method includes subsequently trimming one or more sidewalls of the pattern transferred into the one or more target layers.

8. The method of claim 7, wherein the method includes removing the layered masking structure before trimming the one or more sidewalls of the pattern transferred into the one or more target layers.

9. The method of claim 8, wherein depositing the layer of material on the photoresist masking structure includes depositing a layer of material that has a thickness of no more than about 10 nanometers.

10. The method of claim 9, wherein depositing the layer of material that has a thickness of no more than about 10 nanometers includes depositing a layer of polymer material that comprises silicon, carbon, and fluorine.

11. The method of claim 9, wherein depositing the layer of material that has a thickness of no more than about 10 nanometers includes depositing a layer of material that has a thickness substantially equal to a sidewall roughness of the photoresist masking structure.

12. The method of claim 11, wherein depositing the layer of material on the photoresist masking structure includes using a deposition time of no more than about 10 seconds.

13. A method for reducing the LER of an etched feature, comprising:
forming a photoresist masking structure on a substrate assembly, the substrate assembly including a substrate layer and at least two target layers;
forming a layered masking structure by depositing a layer of polymer on the photoresist masking structure in order to reduce a LER of the photoresist masking structure;
etching a pattern of the layered masking structure into the at least two target layers before trimming the layered masking structure; and
selectively etching to create a lateral recess in at least one of the at least two target layers after the etching of the pattern into the at least two target layers.

14. A method of forming a feature in a substrate assembly, comprising:
forming a photoresist mask feature on a substrate assembly, wherein the photoresist mask feature has walls with an associated line edge roughness (LER);
depositing a layer of polymer on the photoresist mask feature to form a polymerized photoresist mask feature that has walls with an associated LER that is less than the LER associated with the walls of the photoresist mask feature;
etching the substrate assembly to form a feature in a target layer of the substrate assembly, wherein the walls of the polymerized photoresist mask feature are untrimmed prior to etching; and
subsequently trimming a wall of the target layer feature to reduce a LER of the target layer feature.

15. The method of claim 14, wherein depositing the layer of polymer on the photoresist mask feature to form the polymerized photoresist mask feature includes using a flow rate of at least 60 sccm.

16. The method of claim 14, wherein subsequently trimming the wall of the target layer feature reduces the LER of the feature such that the LER of the target layer feature is reduced at least 25% with respect to the LER associated with the walls of the photoresist mask feature.

17. The method of claim 14, wherein the method includes trimming the walls of the photoresist mask feature prior to depositing the layer of polymer on the photoresist mask feature.

18. The method of claim 14, wherein etching the substrate assembly to form a feature in the target layer of the substrate assembly includes forming a target layer feature that has walls having an associated LER which is less than the LER associated with the walls of the photoresist mask feature.

19. The method of claim 14, wherein depositing the layer of polymer on the photoresist mask feature to form the polymerized photoresist mask feature includes depositing a layer of polymer that is substantially conformal over the photoresist mask feature.

20. The method of claim 14, wherein depositing the layer of polymer on the photoresist mask feature to form the polymerized photoresist mask feature includes depositing a polymer that comprises silicon, carbon, and fluorine.

* * * * *

UNITED STATES PATENT AND TRADEMARK OFFICE
CERTIFICATE OF CORRECTION

PATENT NO. : 7,459,363 B2
APPLICATION NO. : 11/359142
DATED : December 2, 2008
INVENTOR(S) : Subramanian Page 1 of 1

It is certified that error appears in the above-identified patent and that said Letters Patent is hereby corrected as shown below:

In column 10, line 63, in Claim 1, delete "alter" and insert -- after --, therefor.

Signed and Sealed this

Third Day of February, 2009

JOHN DOLL
*Acting Director of the United States Patent and Trademark Office*